(12) United States Patent
Nagasaki

(10) Patent No.: US 7,687,320 B2
(45) Date of Patent: Mar. 30, 2010

(54) MANUFACTURING METHOD FOR PACKAGED SEMICONDUCTOR DEVICE

(75) Inventor: Kenji Nagasaki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 461 days.

(21) Appl. No.: 11/511,267

(22) Filed: Aug. 29, 2006

(65) Prior Publication Data
US 2006/0292742 A1  Dec. 28, 2006

Related U.S. Application Data

(62) Division of application No. 10/980,316, filed on Nov. 4, 2004, now Pat. No. 7,122,910.

(30) Foreign Application Priority Data
Mar. 8, 2004  (JP)  ............... 2004-064071

(51) Int. Cl.
H01L 23/29  (2006.01)
H01L 23/12  (2006.01)

(52) U.S. Cl. ............ 438/126; 438/107; 438/958; 257/788; 257/792

(58) Field of Classification Search ............ None
See application file for complete search history.

(56) References Cited

U.S. PATENT DOCUMENTS 6,187,615 B1  2/2001  Kim et al.
6,621,154 B1 *  9/2003  Satoh et al. ............... 257/684

FOREIGN PATENT DOCUMENTS

| CN | 1246731 A | 3/2000 |
|---|---|---|
| JP | 5-82511 | 4/1993 |
| JP | 2001-168126 | 6/2001 |
| JP | 2001-237348 | 8/2001 |
| JP | 2003-23124 | 1/2003 |
| JP | 2003-124392 | 4/2003 |

* cited by examiner

Primary Examiner—Zandra Smith
Assistant Examiner—Pamela E Perkins
(74) Attorney, Agent, or Firm—Rabin & Berdo, PC

(57) ABSTRACT

A semiconductor device in which moisture penetration into the package interior is suppressed, comprising a rewiring layer formed by plating, with improved reliability of electrical characteristics. On the main surface of a semiconductor chip comprising circuit elements and formed on a wafer, a passivation film opposing the circuit elements is formed, so as to expose a first region of the main surface along the edges of the main surface. An insulating film, which extends over the main surface and along the side faces of this passivation film and onto the main surface of the semiconductor chip, is formed such that there remains a second region within the first region, along the edges of the main surface. A sealing layer covering the insulating film is then formed on the second region.

12 Claims, 4 Drawing Sheets

MANUFACTURING METHOD FOR PACKAGED SEMICONDUCTOR DEVICE

This is a division of application Ser. No. 10/980,316, filed on Nov. 4, 2004, the entire contents of which are hereby incorporated herein by reference.

BACKGROUND OF THE INVENTION

1. Field of the Invention

This invention relates to a semiconductor device having a package construction, and a manufacturing method for the device.

2. Description of the Related Art

There have been mounting demands for smaller and thinner external dimensions (also called "package size") for semiconductor devices mounted in portable equipment and other electronic products. This has been attended by increasing interest in CSPs (Chip Size Packages), which are semiconductor devices packaged with external dimensions substantially the same as the external dimensions of a semiconductor chip.

Among CSPs, WCSPs (Wafer-level Chip Size Packages), in which devices are finished up to the external terminal formation process in the wafer state and dicing is then performed to obtain dies, are attracting attention as a form enabling low manufacturing costs.

In WCSPs, a cut surface formed by dicing or similar becomes the side plane of each package. Consequently in a WCSP, the insulating film (for example, a polyimide film) on the passivation film of the substrate is also exposed on the side face. However, in general the above insulating film is hydrophilic, so that moisture penetrates into the package via the exposed insulating film, and there is the problem that wires and other conductive members are corroded.

Various constructions have been proposed to suppress the penetration of moisture from the hydrophilic insulating film into the package interior, and to suppress the degradation of package reliability.

For example, a construction has been proposed in which a passivation film and polyimide film or other insulating film are formed on the wafer, and after the dicing process, the side faces of the insulating film are positioned further inside from the cut surfaces which are to become the package side faces (for example, Japanese Patent Kokai No. 2003-124392; hereafter called "reference 1").

OBJECT AND SUMMARY OF THE INVENTION

However, there are cases in which, owing for example to formation of circuit elements comprised by the semiconductor chip, large steps are formed in the surface of the passivation film which covers the semiconductor chip.

In cases where, as in the construction disclosed in the above reference 1, the side faces of the passivation film are formed so as to be positioned on the inside of the package cut surfaces, the passivation film is known to have an inverted mesa shape, that is, an inverted trapezoid shape.

However, in the WCSP manufacturing process, in general a plating method (electroplating or electroless plating) is used to form the rewiring or other layer of conductive material. As a plating electrode, a passivation film and polyimide film are formed in sequence over the entire substrate surface, and an UBM (Under Barrier Metal) layer is used. On the UBM layer is the rewiring layer, and on top of the rewiring layer, a plating method can be used to form post portions. Moreover, in addition to functioning as a plating electrode, the UBM layer also functions to improve adhesion between the insulating layer and rewiring layer, and to prevent diffusion between these layers.

In the prior art, polyimide or other insulating film is formed only on the main surface of the passivation film. Consequently the passivation film in particular has an inverted mesa shape, and when the insulating film covering the passivation film is provided so as to expose edge portions forming acute angles, it is difficult to use sputtering to form a UBM layer of uniform film thickness on the surface of such edge portions.

When a UBM layer with such formation defects is used as a plating electrode, such problems as an uneven film thickness of the rewiring layer or unsatisfactory plated film formation occur, detracting from the reliability of the completed package.

Hence a principal object of this invention is to provide a semiconductor device and manufacturing method such that the penetration of moisture into the package interior is suppressed, and having highly reliable electrical characteristics, including rewiring layers and similar formed by plating.

In order to attain this object, the semiconductor device manufacturing method of this invention have the following characteristics.

That is, the semiconductor device manufacturing method of this invention comprises a passivation film formation step, insulating film formation step, and sealing layer formation step.

In the passivation film formation step, a passivation film opposing the circuit elements is formed on the main surface of the semiconductor chip comprising circuit elements, so as to expose a first region of the main surface of the semiconductor chip, along the edges of the main surface. In the insulating film formation step, an insulating film is formed, extending over the main surface and along the side faces of the passivation film to the main surface of the semiconductor chip, and such that there remains a second region, within the first region, along the edges of the main surface. In the sealing layer formation step, the sealing layer is formed on the second region and also covers the insulating film.

According to this semiconductor device manufacturing method, steps (height differences) formed due to the passivation film on the substrate can be alleviated by means of the insulating film covering the passivation film. Further, by setting appropriate film fabrication conditions for the insulating film, the shape of the portion of the insulating film corresponding to the edge portion of the passivation film can be made a shape with no angle portion or with an obtuse angle.

As a result, film with uniform film thickness can be fabricated on the insulating film in subsequent steps.

Further, according to this semiconductor device manufacturing method, a semiconductor device can be obtained having a construction in which the side faces of the insulating film are not exposed to the outside by the sealing layer. Hence in the semiconductor device obtained, penetration of moisture from the insulating film into the package interior can be suppressed, and the moisture resistance of the package can be improved.

Hence by means of the semiconductor device and manufacturing method of this invention, a semiconductor device can be obtained with excellent film fabrication stability and moisture resistance, and with improved reliability compared with devices of the prior art.

DESCRIPTION OF THE PREFERRED EMBODIMENTS

Figure 1A:
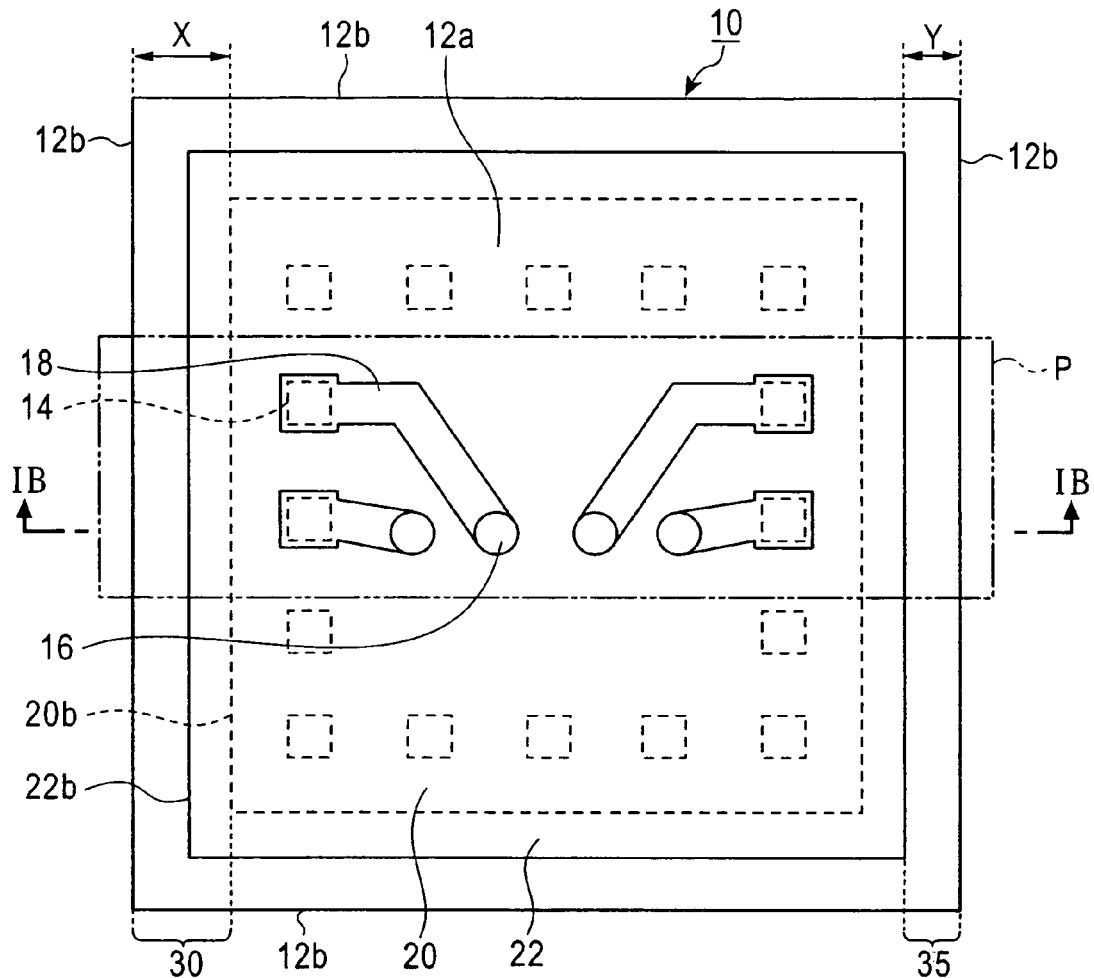
FIG. 1A is a summary plane view showing a semiconductor device of an aspect of this invention.

Below, an aspect of this invention is explained. The drawings merely show in summary the shapes, sizes and positional relations of constituent portions to an extent enabling understanding of the invention, and the invention is not limited to the embodiment shown. In order to facilitate understanding of the drawings, hatchmarks indicating cross-sections have, except in some portions, been omitted. The following explanation is only an appropriate example, and the numerical conditions used as examples need not be employed. Moreover, similar constituent portions in the drawings are assigned the same numbers, and overlapping explanations may be omitted.

The semiconductor device and manufacturing method of an aspect of the invention are explained referring to FIG. 1 through FIG. 4. FIG. 1A is a summary plane view showing a semiconductor device 10 of an aspect of this invention. FIG. 1A shows in detail the constituent elements only in the region surrounded by the bold line P, and omits constituent elements outside the region P. For convenience, the external terminals, sealing layer and similar above the post portions are omitted. FIG. 1B is a cross-sectional view showing in summary the connections and arrangement of constituent elements in the semiconductor device 10 of FIG. 1A, and shows the section obtained by cutting along the dashed line IB-IB in FIG. 1A. FIG. 2 through FIG. 4 are cross-sectional diagrams used in explanation of the method of semiconductor device manufacture of this aspect. In this aspect, a WCSP semiconductor device and manufacturing method for same are explained.

As shown in FIG. 1A, electrode pads 14 are positioned on the main surface 12a of the semiconductor chip 12 (see FIG. 1B) comprising the semiconductor device 10, at a prescribed interval along the outer periphery of the semiconductor chip 12. The electrode pads 14 are electrode surfaces electrically connected to circuit elements, not shown, formed on the surface of the semiconductor chip 12, and comprise, for example, aluminum (Al). The planar shape of the semiconductor chip 12 is a quadrilateral, so that the electrode pads 14 are positioned along each of the edges of the quadrilateral. The electrode pads 14 and the post portions 16 corresponding to these are electrically connected by a wiring layer (also called a "rewiring layer") 18. These post portion 16 and the wiring layer 18 comprise, for example, copper (Cu).

Here, the passivation film 20 does not cover the first region 30 (distance from edge 12b=X) of the main surface 12a of the semiconductor chip 12 along the edges of the main surface 12a (or, the edge lines), so that the side faces 20b do not reach the edges 12b of the semiconductor chip 12 with the main surface.

Further, the insulating film 22 formed on the passivation film 20 covers the entire surface of the passivation film 20, but does not cover the second region 35 (distance from edge 12b=Y (where Y<X)) on the main surface 12a of the semiconductor chip 12 along the edge 12b of the main surface 12a, and so the side face 22b does not reach the edge 12b of the semiconductor chip 12 of the main surface. The passivation film 20 is a film, provided opposing circuit elements, which protects the circuit elements, and comprises, for example, silicon oxide ($SiO_2$) film or silicon nitride (SiN) film. The insulating film 22 is a film with low hardness which absorbs thermal stress and serves as a buffer layer, and comprises, for example, polyimide film.

Figure 1B:
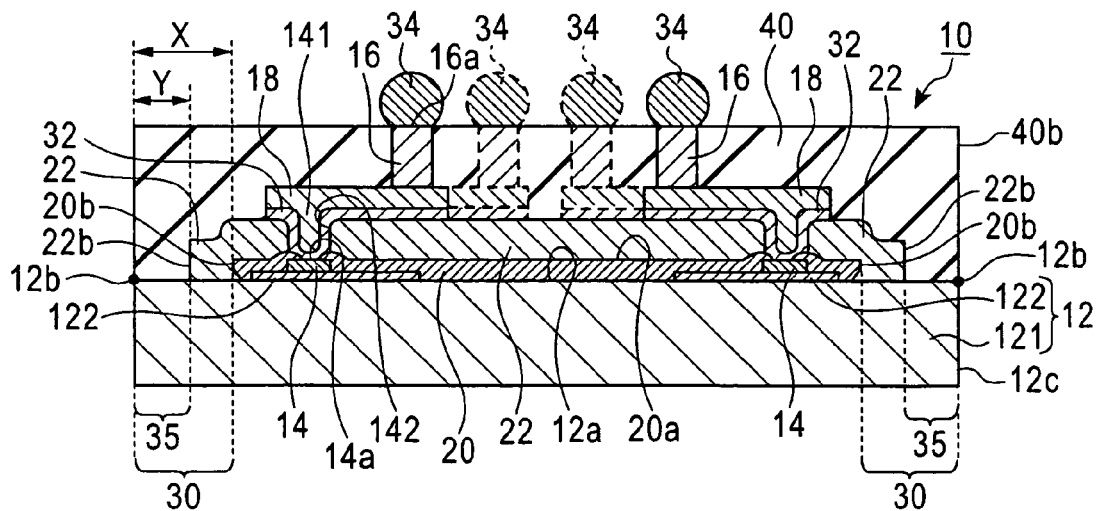
FIG. 1B is a summary cross-sectional view showing a semiconductor device of an aspect of this invention.

Specifically, as shown in FIG. 1B, the semiconductor chip 12 comprises a chip substrate 121 on which are formed circuit elements (not shown) in the surface region, and wiring 122 which electrically connects the circuit elements formed on the chip substrate 121. The wiring 122 comprises, for example, aluminum. The semiconductor chip 12 is not limited only to the above-described construction in which wiring 122 is provided on a chip substrate 121; application to for example a construction comprising a chip substrate 121 alone, without wiring 122 exposed to the surface, is also possible where appropriate, according to the design and specifications.

The passivation film 20 and insulating film 22 are provided, in order, on the main surface 12a of the semiconductor chip 12, such that at least a portion of the top faces of the electrode pads 14 is exposed. That is, the top faces 14a of electrode pads 14 constitute the bottom face of the apertures 141 formed by the passivation film 20 and insulating film 22.

The side faces 20b of the passivation film 20 are formed further inside (distance from side faces 40b of sealing layer =X) from the side face 40b of the sealing layer 40, described below, and a step (or height difference) in the substrate is formed. The main surface 20a and side faces 20b of the passivation film 20 are covered by the insulating film 22. Here, the shape of the passivation film 20 is assumed to be an inverted mesa shape, that is, an inverted trapezoid shape, but may be other shapes as well; and application to any arbitrary appropriate shape is possible.

The insulating film 22 extends, on the main surface 12a of the semiconductor chip 12, over the main surface 20a and along the side faces 20b of the passivation film 20. The side faces 22b of the insulating film 22 are formed further inside (distance from side face 40b of the sealing layer=Y (where Y<X)) than the side faces 40b of the sealing layer 40.

Here, the insulating film 22 is of a shape enabling suppression of moisture penetration into the interior of the semiconductor device 10, and also alleviates steps due to the passivation film 20, forming new steps with small height differences. It is preferable that the side faces 22b of this insulating film 22 be formed 5 μm or more further to the inside than the side faces 40b of the sealing layer 40. By this means, moisture penetration into the insulating film 22 from outside can be reliably suppressed.

Also, a conductive layer 32 is formed, as an UBM (Under Barrier Metal) layer, on the top faces 14a and along the inner-wall faces 142 of the apertures of electrode pads 14, extending onto the insulating film 22. This conductive layer 32 also functions as a plating electrode, described below. This UBM layer is formed from, for example, copper.

On the UBM layer 32 is formed a rewiring layer 18. Solder balls 34, which are external terminals for connection of electrode pads 14 to the mounting board, are individually electrically connected via this rewiring layer 18 and the post portions 16. Through this rewiring layer 18, solder balls 34 can be placed at shifted positions, above the semiconductor chip 12, without depending on the positions of the electrode pads 14. Further, the sealing layer 40 is formed on the first semiconductor chip 12 so as to expose the top faces 16a of the post portions 16.

Next, the method of manufacturing of this semiconductor device 10 is explained, referring to FIG. 2 through FIG. 4.

First, a semiconductor wafer 50, on which a plurality of semiconductor chips 12' are arranged for dicing into individual chips (singulation), is prepared. In the drawings, for convenience approximately three semiconductor chips 12' are shown prior to singulation; but any number may be prepared. Further, gridline regions (not shown) of for example approximately 100 μm are formed between adjacent semiconductor chips 12' on the semiconductor wafer 50 prior to singulation.

Figure 2A:
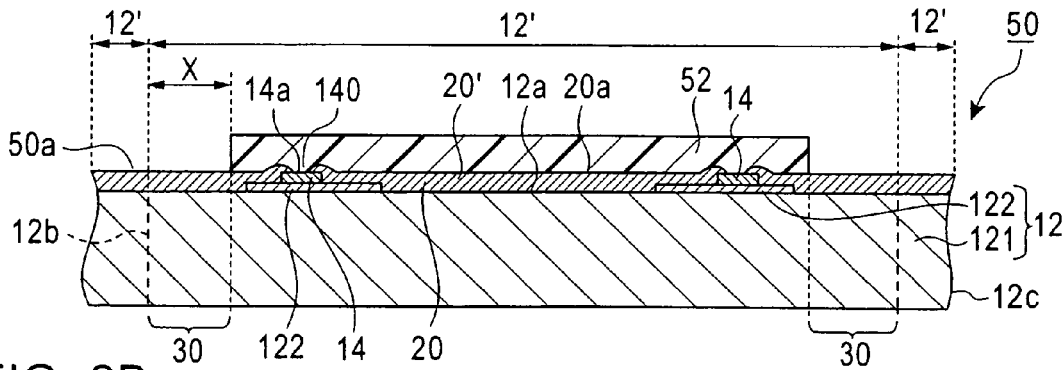
FIG. 2A through FIG. 2D show a (first) semiconductor device manufacturing process of an aspect of the invention.

In the passivation film formation step, a silicon oxide film 20' which is a passivation film is formed to, for example, a film thickness of 5 nm on the main surface 50a of the semiconductor wafer 50. Then, apertures 140 are formed in this silicon oxide film 20' to expose the top surfaces 14a of electrode pads 14 (FIG. 2A).

Following this, a resist layer (not shown) is formed on the silicon oxide film 20' and pad electrodes 14. Then, exposure and development of the resist are performed, to form a mask pattern 52 exposing the passivation film 20', along the edge (or edge lines) 12b of the first region 30 of the main surface 12a of the semiconductor chip 12' (FIG. 2A).

Then this mask pattern 52 is used as a mask to remove by etching the silicon oxide film 20' exposed by the mask pattern 52.

Figure 2B:
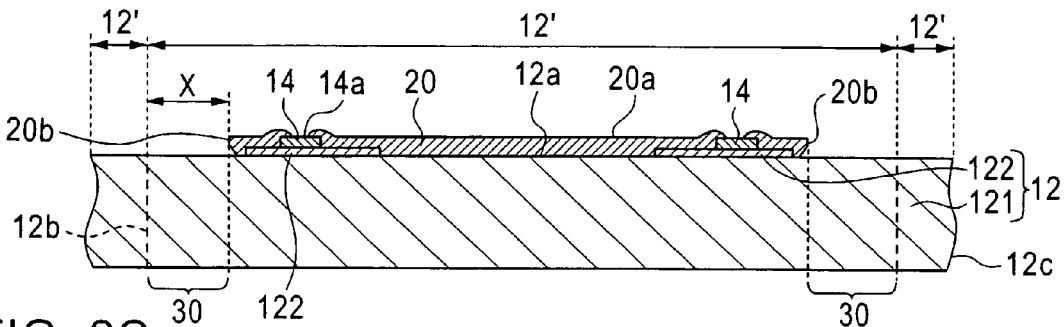

In this way, a passivation film 20 exposing the first region 30 of the main surface 12a can be formed. That is, the wide faces 20b of the passivation film 20 do not reach the edges 12b of the main surface of the semiconductor chip 12' to be singulated. After completion of etching, the mask pattern 52 is removed (FIG. 2B). Here, it is preferable that the positions of the side faces 20b of the passivation film 20 be further inside from the edges 12b of the semiconductor chip 12' by 40 μm (that is, X=40 μm), in consideration of shifts in alignment of the mask pattern 52 and similar. Here the passivation film 20 is assumed to have an inverted mesa shape, but other shapes are possible; for example, a non-inverted mesa shape may be employed.

Figure 2C:
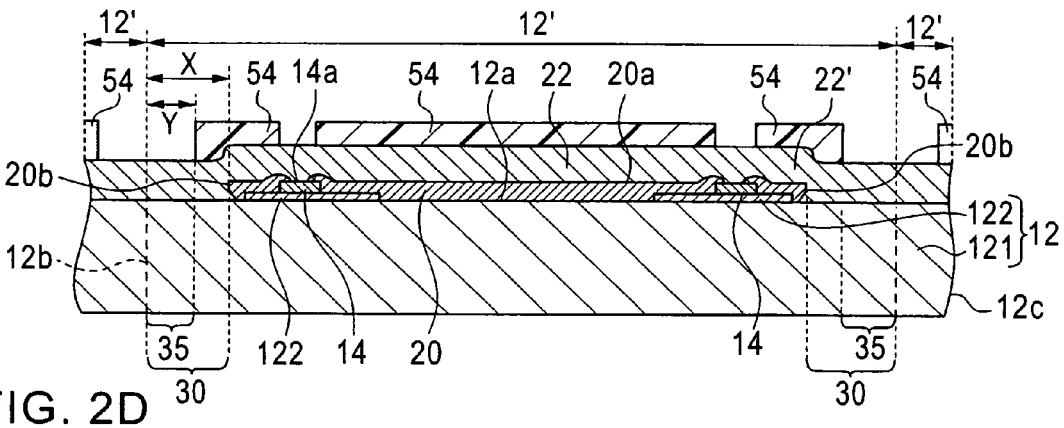

Next, in the insulating film formation step, a polyimide film 22' which is the insulating film is formed, to a film thickness in the range for example of 5 to 30 nm, on the main surface 12a of the semiconductor chip 12, the passivation film 20, and the pad electrodes 14. Here the polyimide film 22' can be formed by first spin-coating a polyimide liquid application onto the main surface 12a of the semiconductor chip 12, passivation film 20 and pad electrodes 14, and then baking (FIG. 2C).

Then, a resist layer (not shown) is formed on the polyimide film 22'. The resist is exposed and developed to form a mask pattern 54, which exposes the polyimide film 22' in the second region 35 along the edges 12b of the main surface 12a of the semiconductor 12' and on the top faces 14a of the electrode pads 14 (FIG. 2C).

Then this mask pattern 54 is used as a mask to remove by etching the polyimide film 22' exposed by the mask pattern 54.

Figure 2D:
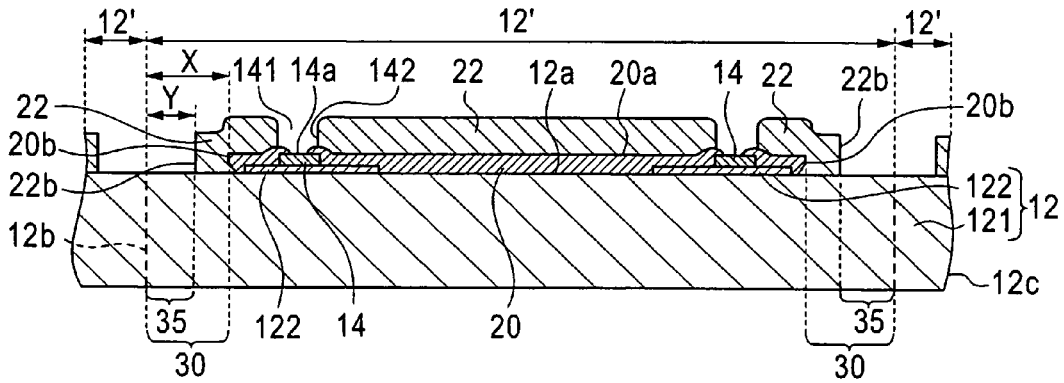

In this way, an insulating film 22 can be formed which exposes the second region 35 of the main surface 12a, as well as the top faces 14a of the electrode pads 14. That is, the side faces 22b of the insulating film 22 do not reach the edges 12b of the main surface 12b of the semiconductor chip 12' which is to be singulated. At the same time, apertures 141 exposing the top faces 14a of electrode pads 14 are formed in the passivation film 20 and insulating film 22 (exposure step). After the completion of etching, the mask pattern 54 is removed (FIG. 2D). By using a method such as spin-coating to form this insulating film 22 in such a manner that the insulating film material, as an application liquid, buries the passivation film 20, the insulating film can be formed reliably on the surface of the passivation film 20, and the shape of the portion of the insulating film 22 corresponding to the edge portions of the passivation film 20 can be formed so as to have no angle portions, or so as to form an obtuse angle. As a result, films of uniform thickness can be formed on the insulating film 22 in subsequent steps (described in detail below). Here, it is appropriate that the insulating film 22 be formed such that the position of the side face 22b of the insulating film 22 is further inward than the edge 12b of the semiconductor chip 12' by from 5 to 20 μm (that is, Y=5 to 20 μm), in consideration of shifts in alignment of the mask pattern 54.

Figure 3A:
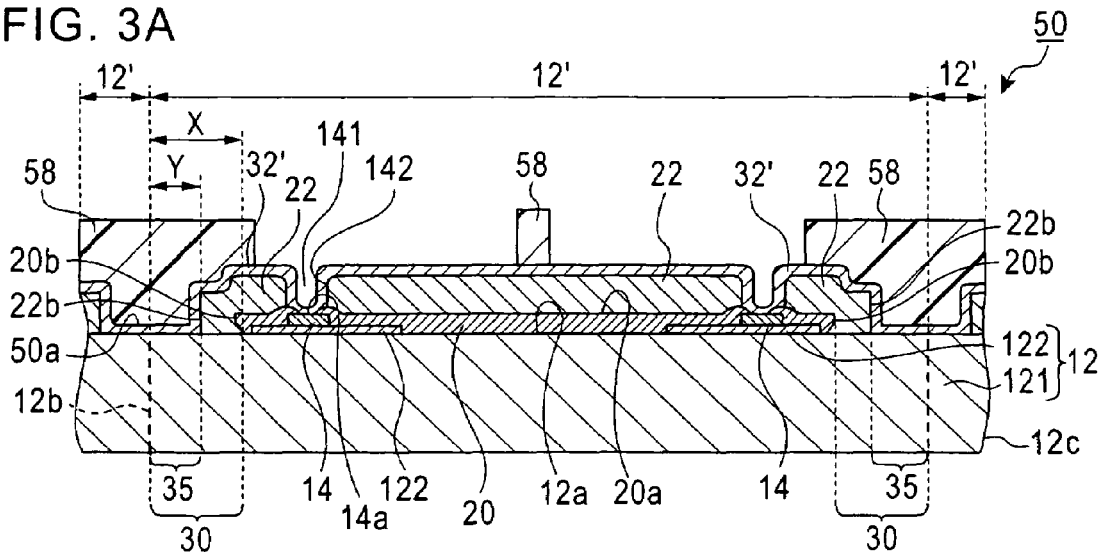
FIG. 3A through FIG. 3C show a (second) semiconductor device manufacturing process of an aspect of the invention.

Next, in the conductive layer formation step, the conductive layer 32' which is the UBM layer is formed in the second region 35 of the main surface 12a of the semiconductor chip 12', and on the polyimide film 22 and inner-wall faces 142 of the apertures 141, to a film thickness of, for example, 5 to 10 nm. As the conductive layer 32', for example, a layer of copper may be formed by sputtering (FIG. 3A).

Next, in the wiring layer formation step, a resist layer (not shown) is formed on the conductive layer 32'. Then, the resist is exposed and developed, to form a mask pattern 58 which exposes the conductive layer 32' in regions where the wiring layer is to be formed (FIG. 3A).

Figure 3B:
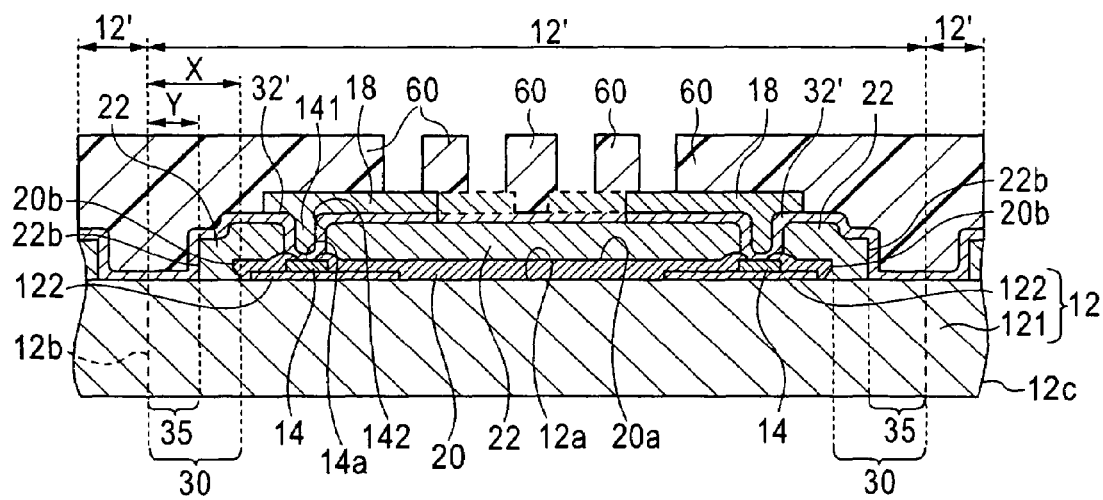

Then, a rewiring layer 18 of copper is formed by plating on the conductive layer 32 exposed by the mask pattern 58, to a thickness in the range of, for example, 5 to 10 nm (FIG. 3B). The rewiring layer 18 can be formed by the electrolytic plating method (also called the electroplating method), or by an electroless plating method. When the rewiring layer 18 is formed by the electrolytic plating method, after for example immersing the semiconductor wafer 50 and a platinum sheet in an electrolytic solution containing the plating material, the wafer 50 is used as a cathode and the platinum sheet as an anode to pass a direct electrical current. By this means, the rewiring layer 18 can be deposited on the conductive layer 32' which is the cathode-side plating electrode.

At this time, the polyimide film 22 underlying the conductive layer 32' forms a new step which alleviates the step due to the passivation film 20. Hence the conductive layer 32' formed on this polyimide film 22 functions as a highly reliable plating electrode with no thickness irregularities.

As a result, the rewiring layer 18 can be formed according to design values, and the occurrence of formation defects as seen in the prior art can be suppressed.

Next, in the post portion formation step, a resist layer (not shown) is formed on the conductive layer 32' and rewiring layer 18. Then, this resist is exposed and developed to form a mask pattern 60 which exposes the rewiring layer 18 in regions where post portions are to be formed (FIG. 3B).

Figure 3C:
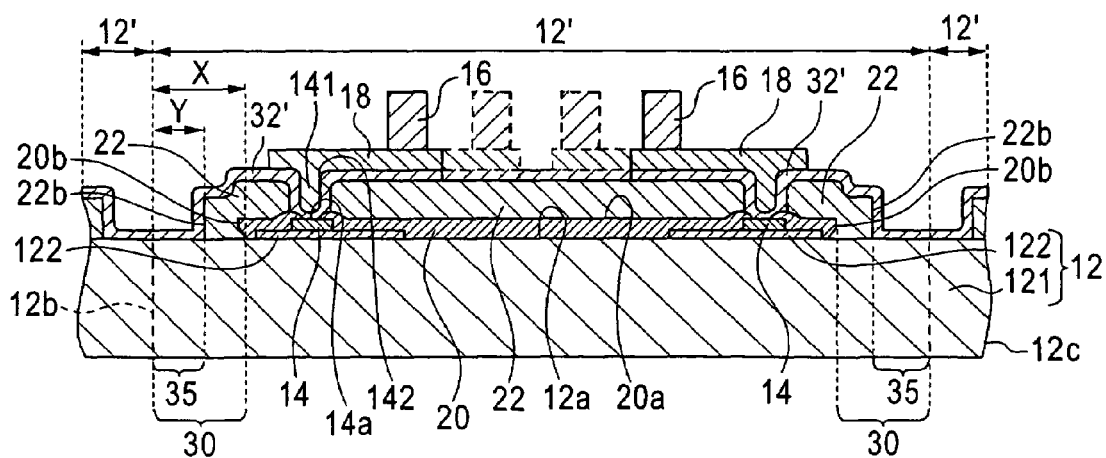

Thereafter, plating is used to form post portions 16 of copper on the rewiring layer 18 exposed by the mask pattern 60 (FIG. 3C). Here also, similarly to formation of the rewiring layer 18, post portions 16 can be formed by either electroplating or by electroless plating.

At this time, the conductive layer 32' and rewiring layer 18 function as a plating electrode; as already explained, these layers both have stable electrical characteristics.

As a result, the post portions 16 can be formed according to design values, and the occurrence of formation defects as seen in the prior art can be suppressed.

Figure 4A:
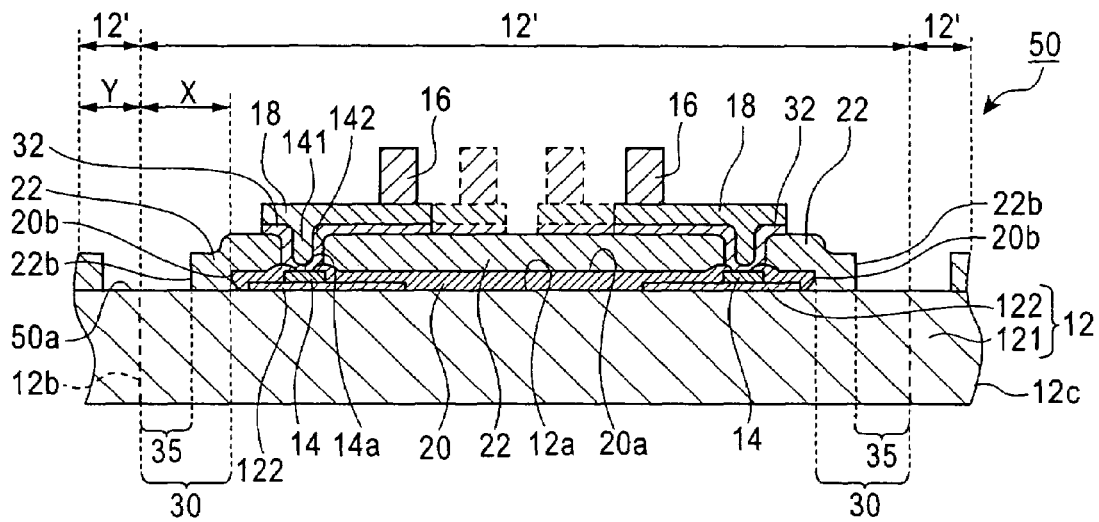
FIG. 4A and FIG. 4B show a (third) semiconductor device manufacturing process of an aspect of the invention.

Then, using the rewiring layer 18 as a mask, the conductive layer 32' exposed by the rewiring layer 18 is removed by etching to form the conductive layer 32 (FIG. 4A).

Next, in the sealing layer formation step, the sealing layer 40 is formed on the main surface 50a of the semiconductor wafer 50, that is, not only on the second region 35 of the semiconductor chip 12', but also such that the post portions 16 are hidden. Here, an epoxy resin or other organic resin is used as the sealing material, and the layer is formed by the transfer molding method.

Figure 4B:
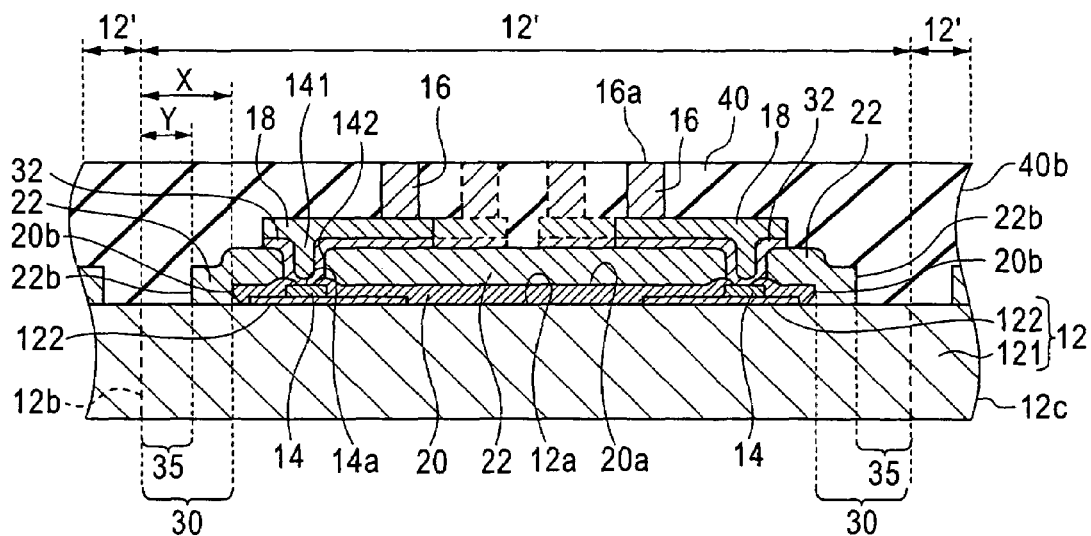

Then a grinder is used to polish the sealing layer 40, and the top surfaces 16a of the post portions 16 which are the external terminal mounting surfaces are exposed (FIG. 4B).

Then, the solder balls 34 which are the external terminals are reflow-soldered on the top surfaces 16a of the exposed post portions 16. A high-speed rotating blade for dicing is then used to perform dicing, for singulation into individual WCSPs (Wafer-level Chip Size Packages) 10 which are the semiconductor devices (FIG. 1B).

The cut surfaces which are the side faces of the diced WCSPs 10 comprise the side faces 12c of the semiconductor chip and the side faces 40b of the sealing layer, and no hydrophilic polyimide film 22 is exposed.

Hence the penetration of moisture from outside into the insulating film 22 can be reliably suppressed, and corrosion of the wiring layer and similar within the package can be prevented.

As is clear from the above explanation, by means of this aspect the step formed by the passivation film on the substrate can be alleviated by the insulating film.

As a result, the film thickness of the conductive layer on the insulating film can be made uniform, and the conductive layer can be made to function as a plating electrode having stable electrical characteristics.

Hence a highly reliable wiring layer and post portions can be formed by plating on the insulating film.

By means of this configuration, a construction is possible in which the sealing layer prevents outside exposure of the side faces of the insulating film.

Hence a semiconductor device affording excellent film deposition reliability and moisture resistance, and with higher reliability than in the prior art, can be realized.

This invention is not limited only to combinations comprising the above-described aspect. This invention can be employed by combining appropriate conditions at arbitrary appropriate stages.

This application is based on a Japanese patent application No. 2004-064071 which is hereby incorporated by reference.

What is claimed is:

1. A method for manufacturing a semiconductor device, comprising:
    a passivation film formation step of forming a passivation film on a main surface of a semiconductor chip including circuit elements and on electrode pads formed on said main surface;
    a removal step of removing a part of said passivation film so as to expose a first region of said main surface along an outer peripheral edge of said main surface so that an outer peripheral edge of said passivation film abuts said first region;
    an insulating film formation step of forming an insulating film covering said first region and said passivation film so as to have a step surface corresponding to said outer peripheral edge of said passivation film, and partially removing said insulating film on the basis of said step thereof, the partially removed insulating film extending over top and side surfaces of said passivation film and partially onto the exposed first region of said main surface, such that a second region within said first region is exposed along said outer peripheral edge of said main surface; and
    a sealing layer formation step of forming on said second region a sealing layer which covers said partially removed insulating film.

2. The method for manufacturing the semiconductor device according to claim 1, wherein, in said insulating film formation step, said insulating film is formed by a spin-coating method.

3. The method for manufacturing the semiconductor device according to claim 1, further comprising, prior to said sealing layer formation step:
    an exposure step of forming apertures passing through said passivation film and said partially removed insulating film so as to expose said top faces of electrode pads formed on the main surface of said semiconductor chip;
    a conductive layer formation step of forming a conductive layer to extend over the top faces of said exposed electrode pads and along the inner-wall faces of said apertures onto said partially removed insulating film; and
    a wiring layer formation step of forming wiring layers by plating a metal on said conductive layer, using said conductive layer as a plating electrode,
    wherein, in said sealing layer formation step, said conductive layer and wiring layer are sealed by said sealing layer.

4. The method for manufacturing the semiconductor device according to claim 3, further comprising, prior to said sealing layer formation step,
    a post portion formation step of forming post portions by partially plating a metal on said wiring layer, using said wiring layer as a plating electrode,
    and wherein, in said sealing layer formation step, said sealing layer is formed on side faces of said post portions to a height at which the top faces of said post portions are exposed.

5. The method for manufacturing the semiconductor device according to claim 3:
    wherein the step forming said passivation film includes forming said passivation film on said electrode pads at a position opposing said circuit elements; and forming an aperture through both of said passivation film and said partially removed insulating film so as to reach to a top face of said electrode pad.

6. The method for manufacturing the semiconductor device according to claim 1,
    wherein, in said sealing layer formation method, said sealing layer is formed such that, when said semiconductor chip is viewed from the direction perpendicular to said main surface of said semiconductor chip, said sealing layer has same external dimensions as external dimensions of said semiconductor chip.

7. The method for manufacturing the semiconductor device according to claim 1,
    wherein, in said insulating film formation step, said partially removed insulating film is formed such that the side faces thereof are positioned 5 µm or more further to the inside than the side faces of said sealing layer.

8. The method for manufacturing the semiconductor device according to claim 1,
    wherein a thickness of said insulating film is larger than that of said passivation film.

9. The method for manufacturing the semiconductor device according to claim 8,
    wherein said thickness of said insulating film is in a range of 5 to 30 nm.

10. The method for manufacturing the semiconductor device according to claim 1, wherein said insulating film consists of polyimide.

11. The method for manufacturing the semiconductor device according to claim 1, wherein said passivation film is an oxidation film.

12. The method for manufacturing the semiconductor device according to claim 1, wherein the side faces of said insulating film are positioned 5 μm or more further to the inside than the side faces of said sealing layer.

* * * * *